United States Patent
Choi et al.

(10) Patent No.: US 7,604,918 B2
(45) Date of Patent: Oct. 20, 2009

(54) PHOTOSENSITIVE POLYMER AND PHOTORESIST COMPOSITION HAVING THE SAME

(75) Inventors: Sang-jun Choi, Seoul (KR); Han-ku Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 257 days.

(21) Appl. No.: 11/655,977

(22) Filed: Jan. 22, 2007

(65) Prior Publication Data

US 2007/0172760 A1      Jul. 26, 2007

(30) Foreign Application Priority Data

Jan. 23, 2006   (KR) ..................... 10-2006-0006958

(51) Int. Cl.
*G03F 7/039*      (2006.01)
*G03C 1/73*       (2006.01)

(52) U.S. Cl. .................... 430/270.1; 326/905; 326/907; 326/921; 326/925; 526/242; 526/256; 526/258; 526/265; 526/266; 526/270; 526/282; 526/284; 526/286; 526/294; 526/295; 526/309; 526/313; 526/316; 526/333; 526/334

(58) Field of Classification Search ........................ None
See application file for complete search history.

(56) References Cited

U.S. PATENT DOCUMENTS 6,639,084 B2   10/2003  Maeda et al. ............... 549/266
6,844,134 B2    1/2005  Choi et al. ............... 430/270.1

FOREIGN PATENT DOCUMENTS

KR    1020000034146 A    6/2000

OTHER PUBLICATIONS

Chemical Abstract 1995:638076—English abstract for Sheveleva et al "Synthesis of 4-hydroxy-4-perfluoroalkyl-1,6-diene polymers under high pressure", Zhurnal Organicheskoi Khimii (1994), 30 (8), p. 1256-1258.*

* cited by examiner

*Primary Examiner*—Sin J. Lee
(74) *Attorney, Agent, or Firm*—Harness, Dickey & Pierce, P.L.C.

(57) ABSTRACT

A photosensitive polymer for a photoresist and a photoresist composition having the same are provided. The photosensitive polymer for a photoresist includes the repeating unit represented by the formula below:

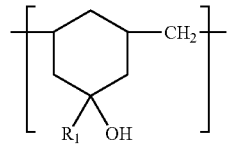

wherein $R_1$ is a $C_1$-$C_{20}$ hydrocarbon group or a $C_1$-$C_{20}$ hetero hydrocarbon group including at least one hetero atom selected from the group consisting of nitrogen, fluorine and sulfur.

17 Claims, No Drawings

PHOTOSENSITIVE POLYMER AND PHOTORESIST COMPOSITION HAVING THE SAME

PRIORITY STATEMENT

This application claims priority the benefit of priority under 35 U.S.C. §119 from Korean Patent Application No. 10-2006-0006958 filed on Jan. 23, 2006 in the Korean Intellectual Property Office, the disclosure of which is incorporated herein by reference in its entirety.

BACKGROUND

1. Field of the Invention

Example embodiments relate to a photosensitive polymer. Other example embodiments relate to a photosensitive polymer for a photoresist and a photoresist composition including the same.

2. Description of the Related Art

Due to an increase in the degree of integration of semiconductor devices, numerous techniques for forming finer patterns exist. Some of the techniques are complicated. As such, conventional photoresists require materials having increased properties.

With the recent advent of lithography technology using ArF (193 nm) as a light source, problems occur with the use of conventional photoresist materials. For instance, ArF (193 nm) has a shorter wavelength than KrF (248 nm). Because conventional aromatic materials are absorbed at 193 nm, conventional photoresist materials are difficult to use with the shorter wavelength range of the ArF light source (or any light source with a smaller wavelength) due to a lower resolution.

The use of polymers (e.g., poly(methacrylate) (PMMA)) has been acknowledged. Polymer materials including PMMA are undesirable due to poor etching selectivity in a dry etching process using plasma gas when fabricating a semiconductor. Problems related to etch resistance must be mitigated using various PMMA derivatives (e.g., adamantane derivatives).

2-methyl-2-adamantyl methacrylate (MAMA), which is well-known in the art, is applied to prepare a copolymer functioning as an ArF photoresist. Photoresist materials that include a MAMA monomer do not simultaneously exhibit dry etch resistance and film adhesion.

Functional monomers have been used to increase dry etch resistance and film adhesion. Functional monomers having a variety of lactonyl groups may improve resolution of the photoresist. As such, functional monomers may be used in 100 nm-scale devices. If sub-100 nm devices are formed when the photoresist is thin, then materials capable of exhibiting higher resolution while increasing dry etching properties may be desired.

SUMMARY

Example embodiments relate to a photosensitive polymer. Other example embodiments relate to a photosensitive polymer for a photoresist and a photoresist composition including the same.

Example embodiments provide a photosensitive polymer for a photoresist, which exhibits increased adhesion to a lower film and/or higher dry etch resistance during lithography using the shorter wavelength of ArF (or any light source with a smaller wavelength).

Other example embodiments provide a photoresist composition including the photosensitive polymer which exhibits increased adhesion to a lower film, higher dry etch resistance and/or higher resolution.

According to example embodiments, there is provided a photosensitive polymer for a photoresist. The photosensitive polymer having repeating units is represented by Structure (I) (below).

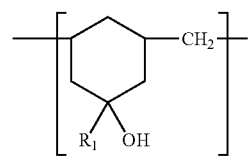

STRUCTURE (I)

In Structure (I), $R_1$ is a $C_1$-$C_{20}$ hydrocarbon group or a $C_1$-$C_{20}$ hetero hydrocarbon group including at least one hetero atom selected from the group consisting of nitrogen, fluorine and sulfur.

According to other example embodiments, there is provided a photosensitive polymer for a photoresist. The photosensitive polymer having repeating units is represented by Structure (II) (below).

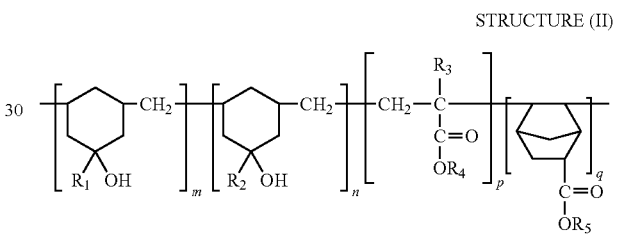

STRUCTURE (II)

In Structure (II), $R_1$ and $R_2$ are each independently a $C_1$-$C_{20}$ hydrocarbon group or a $C_1$-$C_{20}$ hetero hydrocarbon group having at least one hetero atom selected from the group consisting of nitrogen, fluorine and sulfur; $R_3$ is hydrogen or a methyl group; $R_4$ and $R_5$ are each independently a $C_4$-$C_{20}$ acid-labile substituent; and m, n, p and q are each an integer wherein the expressions $0.1 \leq (m+n)/(m+n+p+q) \leq 0.7$ and $0.3 \leq (p+q)/(m+n+p+q) \leq 0.9$ are satisfied.

According to other example embodiments, a photoresist composition is provided. The photoresist composition includes a photosensitive polymer having repeating units represented by Structure (I) and 1-20 wt % of a photoacid generator (PAG) based on the weight of the photosensitive polymer.

According to other example embodiments, another photoresist composition is provided. The photoresist composition includes a photosensitive polymer having the repeating unit represented by Structure (II) and 1-20 wt % of a PAG based on the weight of the photosensitive polymer.

DESCRIPTION OF EXAMPLE EMBODIMENTS

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while the example embodiments are capable of various modifications and alternative forms, embodiments thereof are shown by way of example in the drawings and will herein be described in detail. It should be understood, however, that there is no intent to limit example embodiments to the particular forms disclosed, but on the contrary, the example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to the example embodiments described.

Example embodiments relate to a photosensitive polymer. Other example embodiments relate to a photosensitive polymer for a photoresist and a photoresist composition including the same.

The photosensitive polymer for a photoresist has a repeating unit represented by Structure (I):

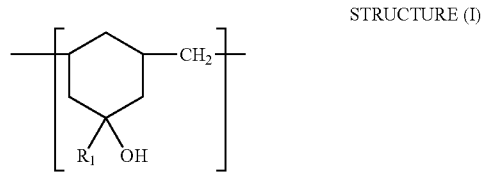

STRUCTURE (I)

In Structure (I), $R_1$ is a $C_1$-$C_{20}$ hydrocarbon group or a $C_1$-$C_{20}$ hetero hydrocarbon group including a hetero atom (e.g., nitrogen, fluorine or sulfur) but is not limited thereto. The hydrocarbon group or hetero hydrocarbon group may be aliphatic or aromatic.

If a photosensitive polymer includes cyclohexane as a main chain and a (hetero) hydrocarbon group ($R_1$) and a hydroxyl group (OH) as substituents, then the photosensitive polymer exhibits increased dry etch resistance and/or adhesion to a lower film.

The photosensitive polymer has an average molecular weight (MW) ranging from about 3000 to 50000 in consideration of solubility in a solvent or photoresist properties.

In other example embodiments, $R_1$ may be at least one substituent selected from the group shown below in Substituent Group (I).

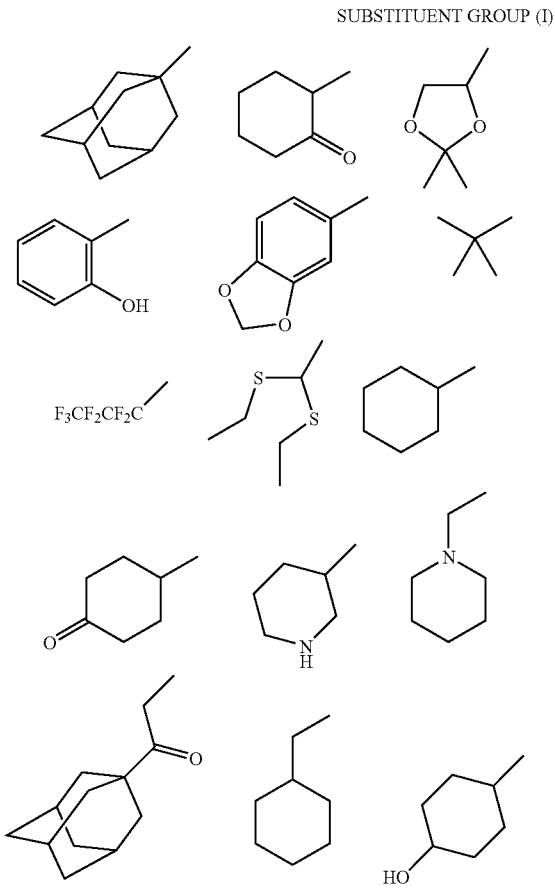

SUBSTITUENT GROUP (I)

-continued

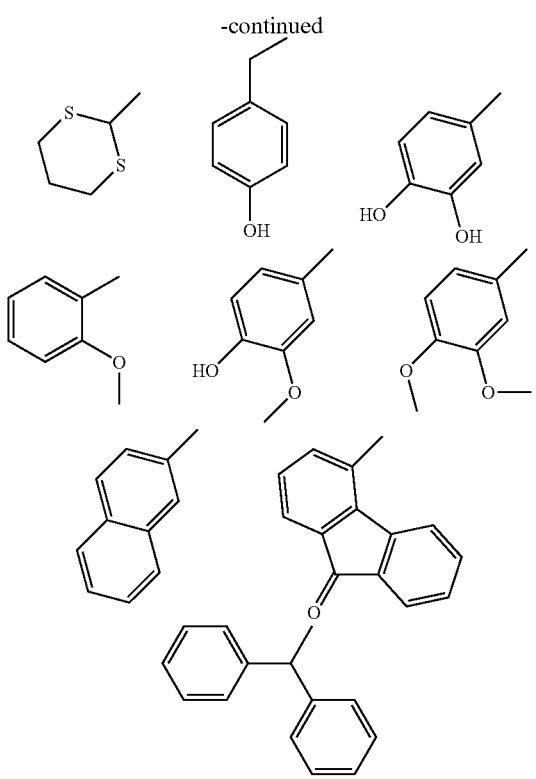

The photosensitive polymer for a photoresist further includes an acid-labile repeating unit. The acid-labile repeating unit represents a repeating unit that has an acid-labile group decomposable in the presence of acid. The acid-labile group may include a carboxyl group, which is soluble in an alkaline developing solution through decomposition of the acid-labile group in acid. Examples of the acid-labile repeating unit include, but are not limited to, acrylate derivatives, methacrylate derivatives, maleic anhydride derivatives, styrene derivatives and norbornene derivatives, each of which is coupled with a $C_4$-$C_{20}$ acid-labile substituent.

Examples of the acid-labile substituent include, but are not limited to, tert-butyl, tetrahydropyranyl, 1-ethoxyethyl, 2-methyl-2-adamantyl, 2-ethyl-2-adamantyl, 2-propyl-2-adamantyl, 8-methyl-8-tricyclodecyl and 8-ethyl-8-tricyclodecyl.

In other example embodiments, a photosensitive polymer for a photoresist as described below is provided. Description of like features of the photosensitive polymers will be omitted for the sake of brevity.

The photosensitive polymer for a photoresist has a repeating unit represented by Structure (II):

STRUCTURE (II)

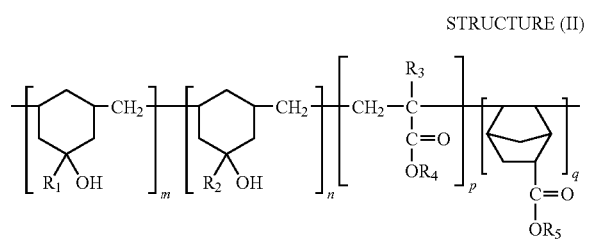

In Structure (II), $R_1$ and $R_2$ are each independently a $C_1$-$C_{20}$ hydrocarbon group or a $C_1$-$C_{20}$ hetero hydrocarbon group including at least one hetero atom selected from the group including nitrogen, fluorine and sulfur; $R_3$ is hydrogen or a methyl group; $R_4$ and $R_5$ are each independently a $C_4$-$C_{20}$ acid-labile substituent; and m, n, p and q are each an integer wherein the expressions $0.1 \leq (m+n)/(m+n+p+q) \leq 0.7$ and $0.3 \leq (p+q)/(m+n+p+q) \leq 0.9$ are satisfied. The photosensitive polymer has an average molecular weight (MW) of about 3000 to 50000.

If either the m integer or the n integer is 0, then the other integer must be a positive integer. If either the p integer or the q integer is 0, then the other integer must be a positive integer.

$R_1$ and $R_2$, which are the same or different from each other, may be independently selected from Substituent Group (I).

Examples of $R_4$ and $R_5$, which are acid-labile substituents, include, but are not limited to, tert-butyl, tetrahydropyranyl, 1-ethoxyethyl, 2-methyl-2-adamantyl, 2-ethyl-2-adamantyl, 2-propyl-2-adamantyl, 8-methyl-8-tricyclodecyl and 8-ethyl-8-tricyclodecyl.

According to other example embodiments, a photoresist composition as described below is provided.

The photoresist composition includes at least one of the photosensitive polymers mentioned above and a photoacid generator (PAG). An amount of the PAG is about 1-20 wt % based on the weight of the photosensitive polymer.

The PAG may include, but is not limited to, triallylsulfonium salts, diallyliodonium salts and mixtures thereof. Examples of the PAG include triphenylsulfonium triflate, triphenylsulfonium nonaflate, diphenyliodonium triflate and di-t-butylphenyliodonium triflate.

The photoresist composition may also include 0.1-20 wt % of an organic base based on the weight of the PAG. The organic base includes tertiary amines (e.g., triethylamine, triisopropylamine, diethanolamine and/or triethanolamine), which may be used alone or in combination.

The solvent of the photoresist composition may include, but is not limited to, PGMEA (Propylene Glycol Monomethyl Ether Acetate), PGME (Propylene Glycol Methyl Ether), EL (Ethyl Lactate) and cyclohexanone. The photoresist composition may be prepared (or formulated) as a solution using a solvent. The amount of the photosensitive polymer used is about 1-20 wt % based on the total weight of the solution, but the amount thereof may be controlled depending on the thickness of the resist to be applied within a range that does not inhibit the example embodiments.

The photoresist composition may further include an additive which may be typically used within a range that does not inhibit the example embodiments. For instance, if the photoresist composition is applied, then a non-ionic surfactant may be used to decrease (or prevent) poor coatability and/or increase film adhesion.

The photoresist composition may be applied by any well-known lithography process. The photoresist composition has a higher transmittance at a shorter wavelength of ArF (or shorter) and at the wavelength of KrF. The photoresist composition may be developed using a general developing solution. The photoresist composition has increased dry etch resistance and/or adhesion to a lower film. As such, finer patterns may be obtained at higher resolutions using the photoresist composition according to example embodiments.

A further understanding of the example embodiments may be obtained through the following synthesis examples and test examples, which are set forth to illustrate, but are not to be construed as the limit of the example embodiments.

EXAMPLE 1

Synthesis of Monomer (I)

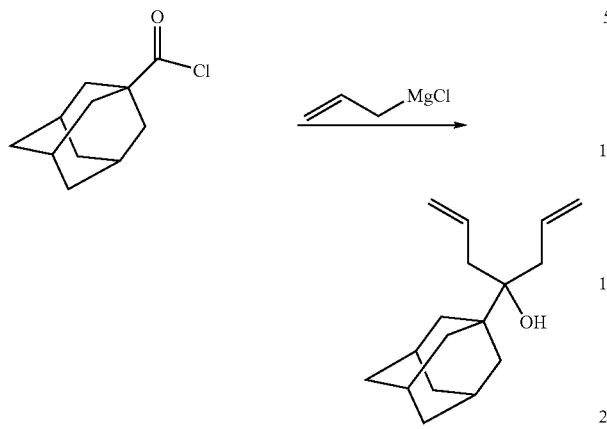

In a 500 ml three-neck flask, 1-adamantanecarbonyl chloride (10 g, 0.05 mol) was dissolved in anhydrous THF (100 ml). An allylmagnesium chloride solution (2 M THF, 0.2 mol) was slowly added in droplets thereto at 0° C. The reaction mixture was allowed to react at room temperature for 12 hours. After the completion of the reaction, the reaction product was added in droplets into excess water, neutralized with diluted HCl and extracted using an appropriate amount of diethyl ether. The organic layer was separated, dried over $MgSO_4$. Monomer (I) was separated from the mixture using column chromatography (ethyl acetate:hexane=3:1) (yield 60%).

EXAMPLE 2

Synthesis of Monomer (II)

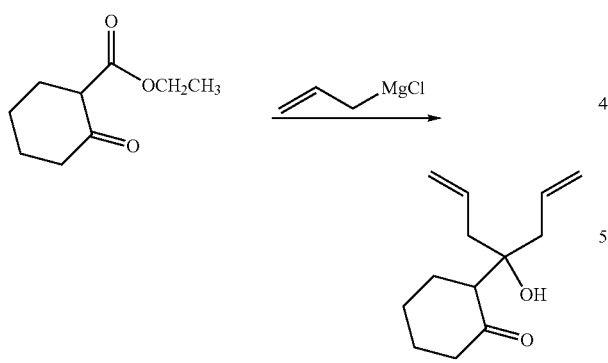

Ethyl 2-cyclohexanonecarboxylate (0.1 mol) was dissolved in anhydrous THF (150 ml). An allylmagnesium chloride solution (2 M THF, 0.3 mol) was slowly added in droplets thereto at room temperature. The reaction mixture was stirred for about 30 min and allowed to react at about 50° C. for 12 hours. After completion of the reaction, the reaction product was added in droplets into excess water, neutralized with diluted HCl and extracted with an appropriate amount of diethyl ether. The organic layer was separated, dried over $MgSO_4$. Monomer (II) was separated from the mixture by vacuum distillation (yield 65%).

EXAMPLE 3

Synthesis of Monomer (III)

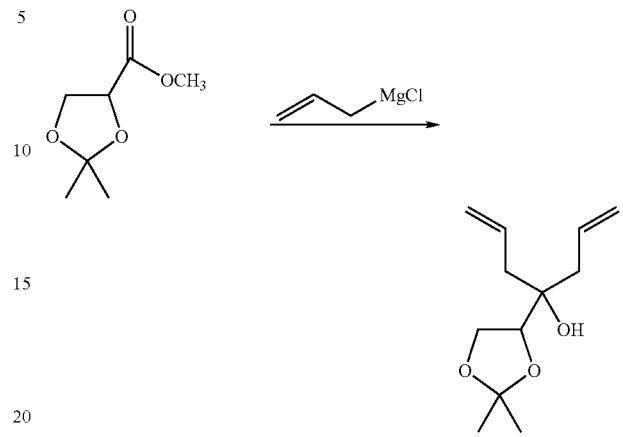

Methyl 2,2-dimethyl-1,3-dioxolane-4-carboxylate (0.1 mol) was reacted with an allylmagnesium chloride solution (2 M THF, 0.3 mol) in the same manner as in Example 2, forming monomer (III) (yield 68%).

EXAMPLE 4

Synthesis of Monomer (IV)

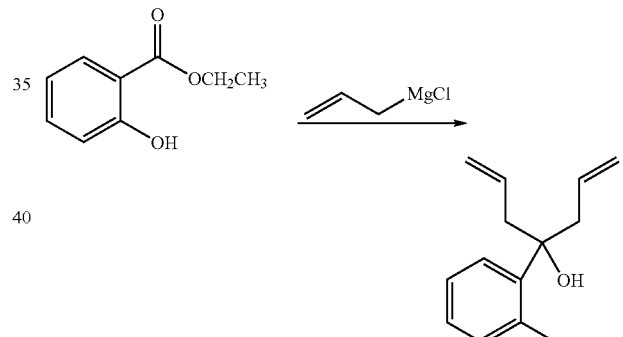

Ethyl salicylate (0.1 mol) was reacted with an allylmagnesium chloride solution (2 M THF, 0.4 mol) in the same manner as in Example 2. Monomer (IV) was separated from the mixture using column chromatography (ethyl acetate:hexane=1:1) (yield 60%).

EXAMPLE 5

Synthesis of Monomer (V)

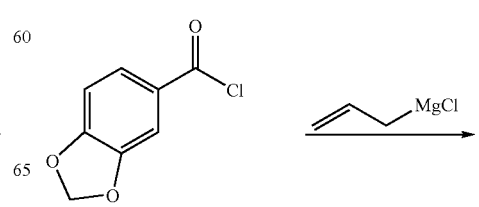

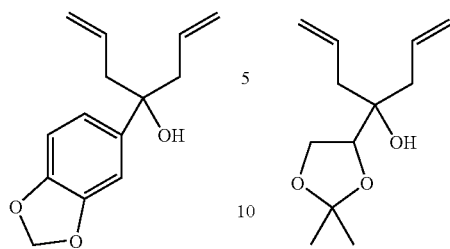

Piperonyloyl chloride (0.1 mol) was reacted with an allylmagnesium chloride solution (2 M THF, 0.3 mol) in the same manner as in Example 1. Monomer (V) was separated using column chromatography (ethyl acetate:hexane=2:1) (yield 65%).

As shown in Examples 1-5, monomers having various structures were synthesized by reacting an acid chloride or ethyl (methyl) carboxylate with a Grignard reagent. The monomers were easily purified using vacuum distillation or column chromatography with a yield in the range of 50-80%.

Using the monomers, photosensitive polymers were prepared as follows.

EXAMPLE 6

Synthesis of Photosensitive Polymer (I)

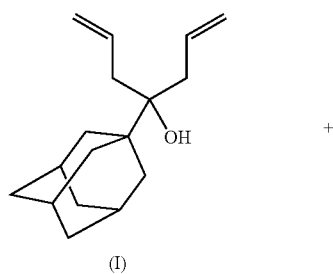

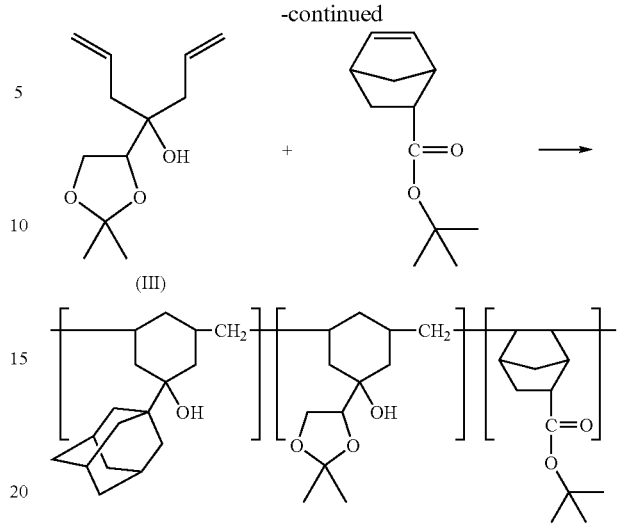

In a round bottom flask, monomer (I) (10 mmol) of Example 1, monomer (III) (10 mmol) of Example 3 and t-butyl 5-norbornene-2-carboxylate monomer (10 mmol) were dissolved along with AIBN (azobisisobutyronitrile) (4 mol %) in anhydrous THF (amount of monomer×2). The mixture was purged for 30 min using nitrogen gas and polymerized at 65° C. for about 12 hours. After polymerization, the reaction product was slowly precipitated in excess n-hexane. The precipitate, polymer (I), was dried in a vacuum oven at 50° C. for 24 hours (yield 55%, average molecular weight (MW)=8,700, dispersion (MW/Mn)=1.9).

EXAMPLE 7

Synthesis of Photosensitive Polymer (II)

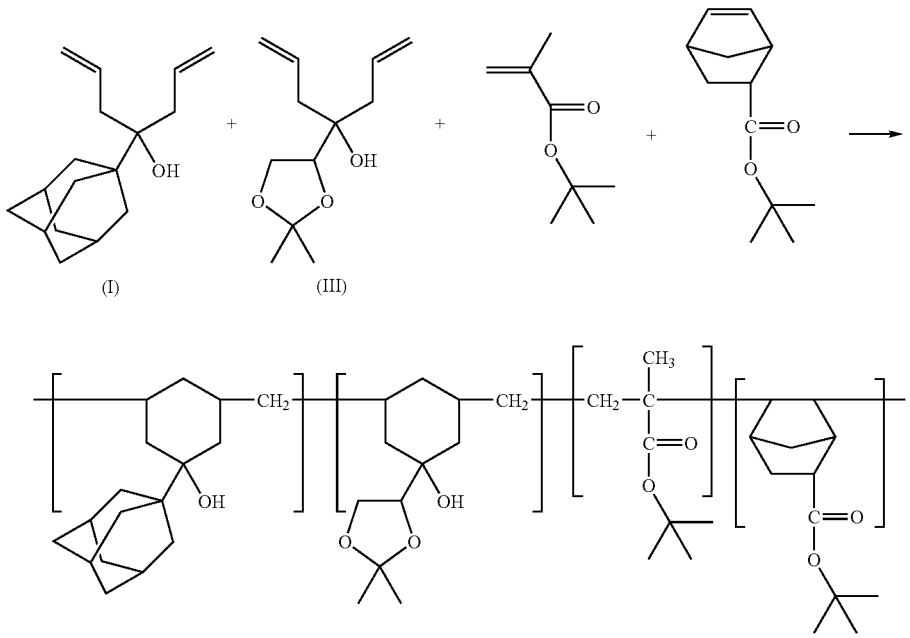

Monomer (I) (5 mmol) of Example 1, monomer (III) (5 mmol) of Example 3, t-butyl methacrylate monomer (5 mmol) and t-butyl 5-norbornene-2-carboxylate monomer (5 mmol) were dissolved along with AIBN (4 mol %) in anhydrous THF (amount of monomer×2). The mixture was polymerized in the same manner as in Example 6, forming polymer (II) (yield 50%, MW=7,900, MW/Mn=1.9).

EXAMPLE 8

Synthesis of Photosensitive Polymer (III)

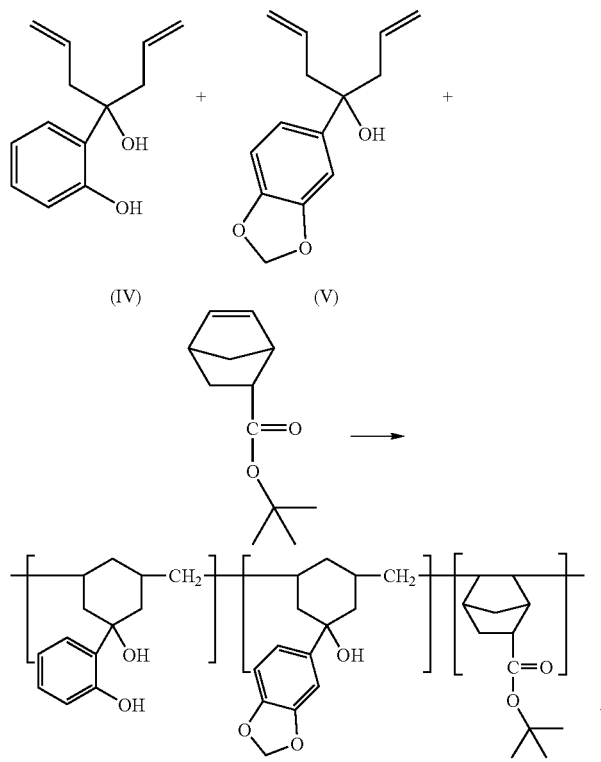

Monomer (IV) (10 mmol) of Example 4, monomer (V) (10 mmol) of Example 5 and t-butyl 5-norbornene-2-carboxylate monomer (10 mmol) were dissolved along with AIBN (4 mol %) in anhydrous THF (amount of monomer×2). The mixture was polymerized in the same manner as in Example 6, forming polymer (III) (yield 55%, MW=8,300, Mw/Mn=1.8).

EXAMPLE 9

Synthesis of Photosensitive Polymer (IV)

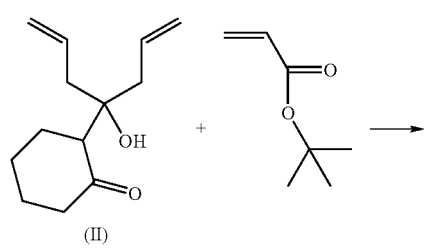

-continued

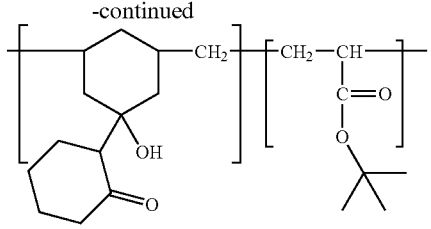

Monomer (II) (10 mmol) of Example 2 and t-butyl acrylate (10 mmol) were dissolved along with AIBN (4 mol %) in anhydrous THF (amount of monomer×2). The mixture was polymerized in the same manner as in Example 6, forming polymer (IV) (yield 50%, MW=9,300, MW/Mn=1.8).

EXAMPLE 10

Synthesis of Photosensitive Polymer (V)

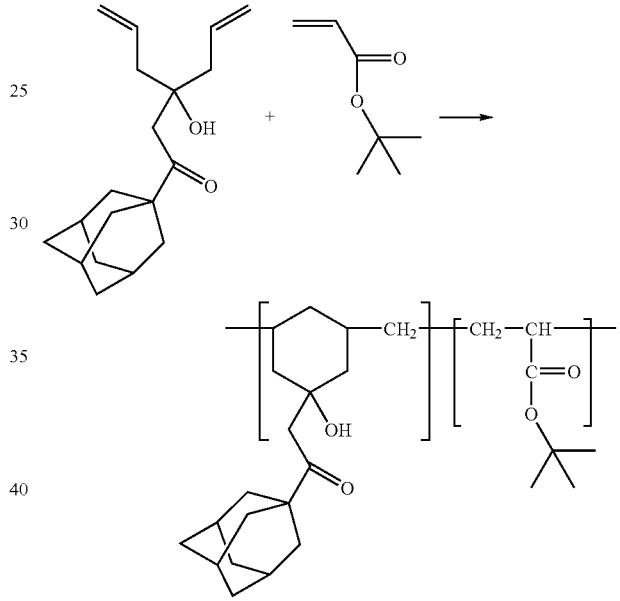

1-Adamantanyl-3-allyl-3-hydroxy-5-hexen-1-one (10 mmol) and t-butyl acrylate (10 mmol) were dissolved along with AIBN (4 mol %) in anhydrous THF (amount of monomer×2). The mixture was polymerized in the same manner as in Example 6, forming polymer (V) (yield 50%, MW=8,800, Mw/Mn=1.9).

EXAMPLE 11

Synthesis of Photosensitive Polymer (VI)

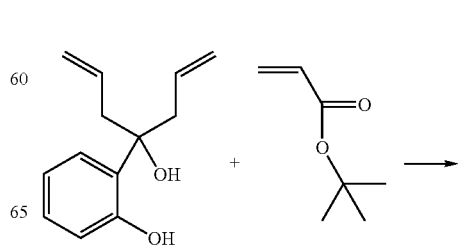

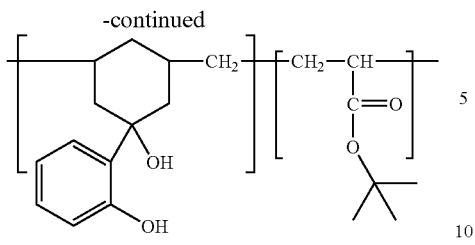

Monomer (IV) (10 mmol) of Example 4 and t-butyl acrylate (10 mmol) were dissolved along with AIBN (4 mol %) in anhydrous THF (amount of monomer×2). The mixture was polymerized in the same manner as in Example 6, forming polymer (VI) (yield 50%, MW=9,100, MW/Mn=1.9).

EXAMPLE 12

Synthesis of Photosensitive Polymer (VII)

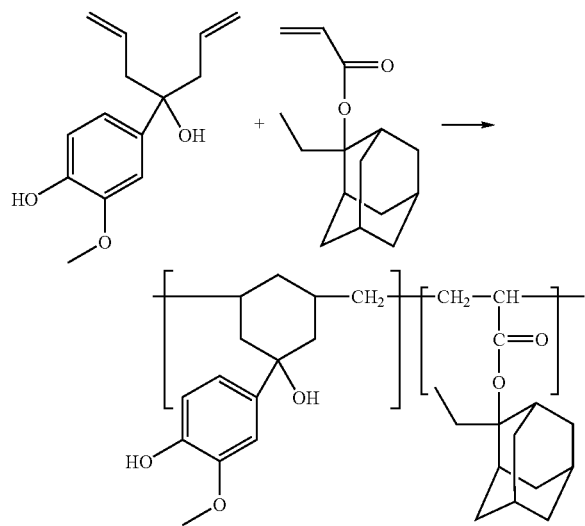

4-(1-Allyl-1-hydroxy-3-butenyl)-2-methoxy-phenol monomer (10 mmol) and 2-ethyl-2-adamantyl acrylate (10 mmol) were dissolved along with AIBN (4 mol %) in anhydrous THF (amount of monomer×2). The mixture was polymerized in the same manner as in Example 6, forming polymer (VII) (yield 50%, MW=9,600, MW/Mn=1.9).

EXAMPLE 13

Synthesis of Photosensitive Polymer (VIII)

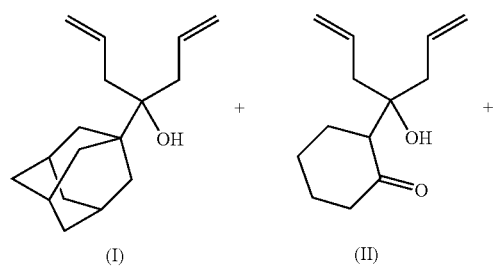

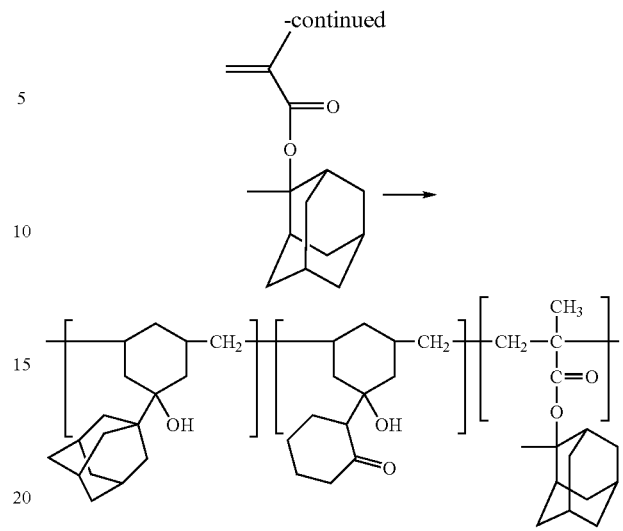

Monomer (I) of Example 1 (10 mmol), monomer (II) of Example 2 (10 mmol) and 2-methyl-2-adamantyl methacrylate (10 mmol) were dissolved along with AIBN (4 mol %) in anhydrous THF (amount of monomer×2). The mixture was polymerized in the same manner as in Example 6, forming polymer (VIII) (yield 50%, MW=8,600, MW/Mn=1.9).

Using the photosensitive polymers, photoresist compositions were prepared and evaluated for usefulness in patterning.

TEST EXAMPLE 1

Preparation of Photoresist Composition (I) and Patterning Evaluation

Photosensitive polymer (V) of Example 10 (1 g) and triphenylsulfonium triflate (TPSOTf) (0.02 g) were dissolved in propylene glycol methyl ether acetate (PGMEA) (10 g). Triisobutylamine (1 mg) was added to the solution. The solution was filtered using a 0.2 μm membrane filter. The filtered photoresist solution was applied with a thickness of 200 nm on a bare Si wafer (290 Å thick) using organic BARC (AR46, Rohm-Hass) and pre-baked at 110° C. for 60 sec. Several processes of subjecting the wafer to exposure using an ASML1100 ArF scanner (0.75 NA, annular, σ 0.85/0.55), post-exposure baking (PEB) at 110° C. for 60 sec and developing for 60 sec using 2.38 wt % tetramethylammonium hydroxide (TMAH) as a developing solution were performed, forming a clear 150 nm line. A space pattern was confirmed at a dose of 15 mJ/cm$^2$.

TEST EXAMPLE 2

Preparation of Photoresist Composition (II) and Patterning Evaluation

Polymer (VI) of Example 11 (1 g), TPSOTf (5 mg), and triphenylsulfonium nonaflate (10 mg) were dissolved in PGMEA (10 g). Triisooctylamine (2 mg) was added to the solution. The solution was filtered using a 0.2 μm membrane filter. The filtered photoresist solution was applied with a thickness of 200 nm on a bare Si wafer (290 Å thick) using organic BARC (AR46, Rohm-Hass) and pre-baked at 110° C. for 60 sec. Several processes of subjecting the wafer to exposure using an ASML800 KrF scanner (0.80 NA, annular, σ 0.85/0.55), post-exposure baking at 110° C. for 60 sec and developing for 60 sec using a 2.38 wt % TMAH developing solution were performed, forming a clear 200 nm line. A space pattern was confirmed at a dose of 16 mJ/cm².

As described herein, example embodiments provide a photosensitive polymer for a photoresist and a photoresist composition having the same. In the photosensitive polymer, cyclohexane, which is a cyclic structure having both a hydroxyl group and a hydrocarbon group, is used as a main chain. As such, the photoresist composition having the photosensitive polymer exhibits increased dry etch resistance and/or adhesion to a lower film. The composition has increased transmittance not only at the wavelength of KrF but also at the wavelength of ArF (or shorter). The composition functions as a shorter wavelength source such that fine patterns may be formed at higher resolutions.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A photosensitive polymer, comprising a repeating unit represented by the Structure (I):

STRUCTURE (I)

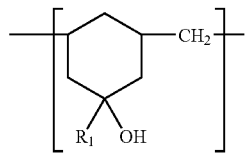

wherein $R_1$ is a $C_1$-$C_{20}$ hydrocarbon group or a $C_1$-$C_{20}$ hetero hydrocarbon group including at least one hetero atom selected from the group consisting of nitrogen, fluorine and sulfur, and $R_1$ includes at least one substituent selected from the group shown in Substituent Group (I):

SUBSTITUENT GROUP (I)

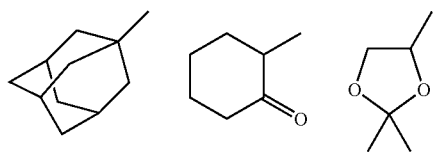

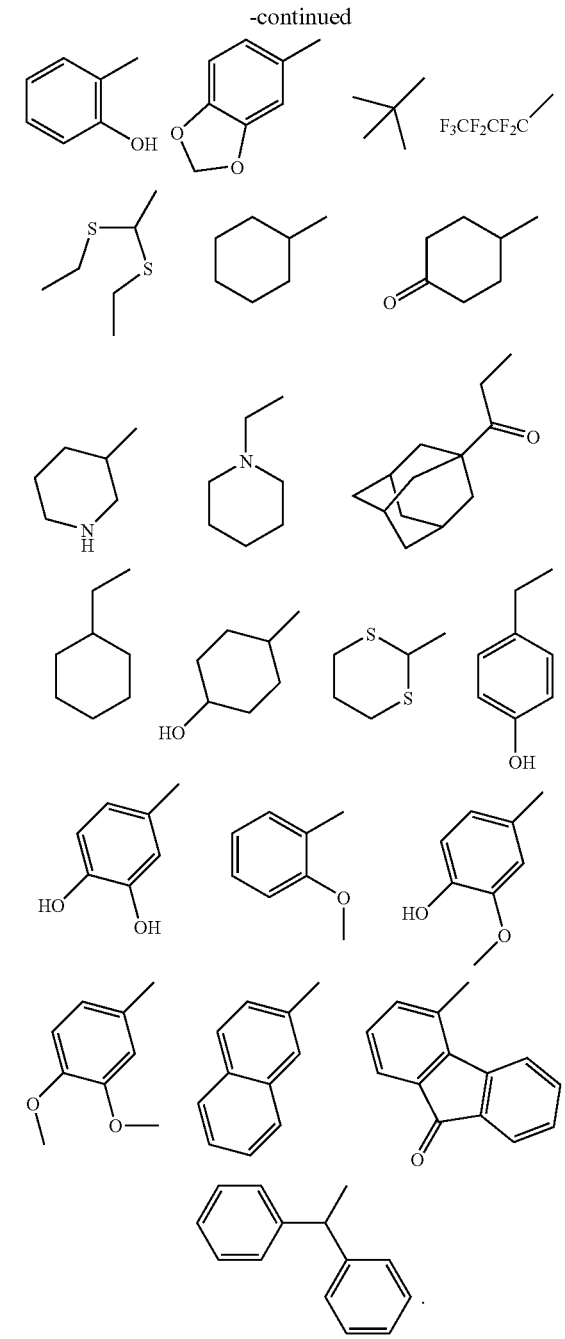

2. The photosensitive polymer according to claim 1, wherein the repeating unit further comprises:

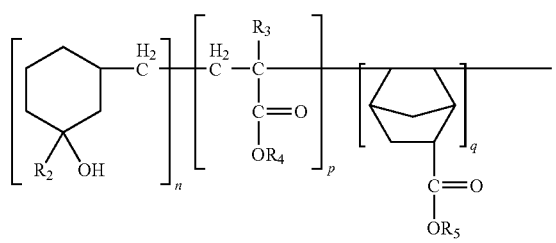

forming Structure (II):

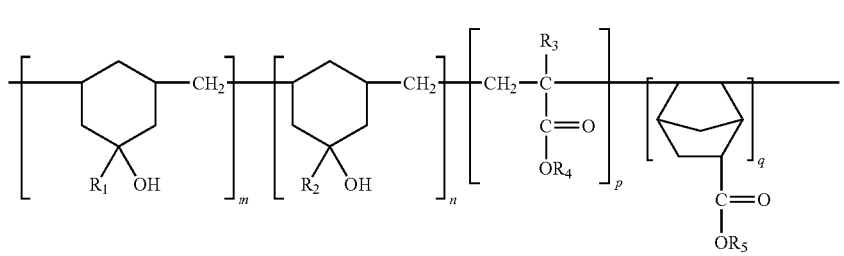

STRUCTURE (II)

wherein $R_2$ is a $C_1$-$C_{20}$ hydrocarbon group or a $C_1$-$C_{20}$ hetero hydrocarbon group including at least one hetero atom selected from the group consisting of nitrogen, fluorine and sulfur, $R_3$ is hydrogen or a methyl group, $R_4$ and $R_5$ are each independently a $C_4$-$C_{20}$ acid-labile substituent, and m, n, p and q are each an integer wherein the expressions $0.1 \leq (m+n)/(m+n+p+q) \leq 0.7$ and $0.3 \leq (p+q)/(m+n+p+q) \leq 0.9$ are satisfied.

3. The photosensitive polymer of claim 2, wherein $R_2$ includes at least one substituent selected from the group shown in Substituent Group (I):

SUBSTITUENT GROUP (I)

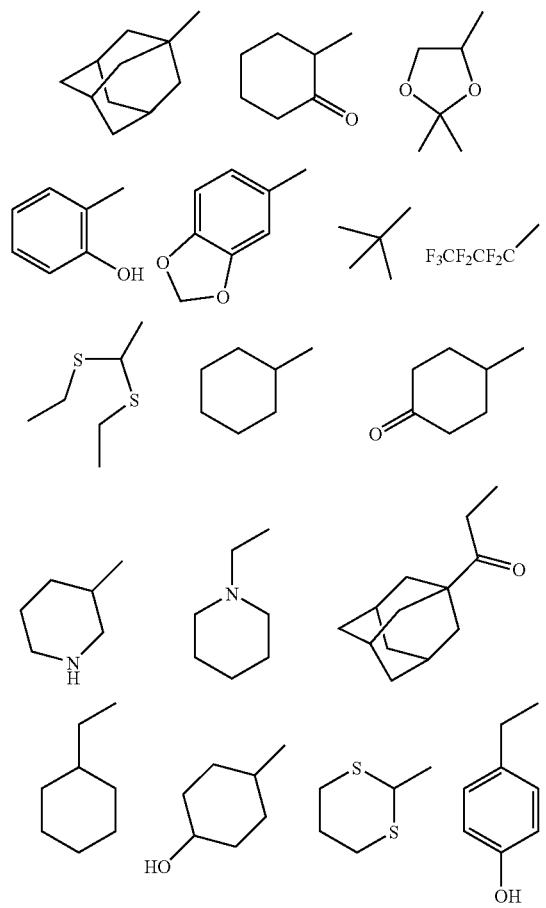

-continued

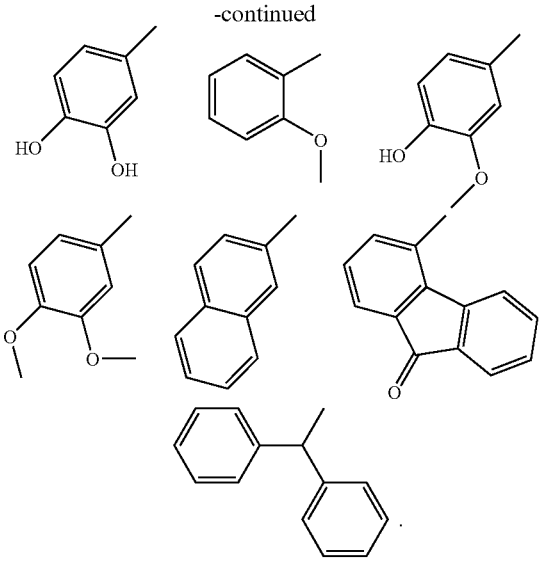

4. The photosensitive polymer of claim 2, wherein the acid-labile substituent includes at least one selected from the group consisting of tert-butyl, tetrahydropyranyl, 1-ethoxyethyl, 2-methyl-2-adamantyl, 2-ethyl-2-adamantyl, 2-propyl-2-adamantyl, 8-methyl-8-tricyclodecyl and 8-ethyl-8-tricyclodecyl.

5. A photosensitive polymer, comprising:
a repeating unit represented by the Structure (I):

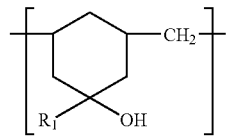

STRUCTURE (I)

wherein $R_1$ is a $C_1$-$C_{20}$ hydrocarbon group or a $C_1$-$C_{20}$ hetero hydrocarbon group including at least one hetero atom selected from the group consisting of nitrogen, fluorine and sulfur; and
at least one acid-labile repeating unit selected from the group consisting of acrylate derivatives, methacrylate derivatives, maleic anhydride derivatives, styrene derivatives and norbornene derivatives,
wherein the acid-labile repeating unit is coupled with a $C_4$-$C_{20}$ acid-labile substituent.

6. The photosensitive polymer of claim 5, wherein the acid-labile substituent includes at least one selected from the group consisting of tert-butyl, tetrahydropyranyl, 1-ethoxyethyl, 2-methyl-2-adamantyl, 2-ethyl-2-adamantyl, 2-propyl-2-adamantyl, 8-methyl-8-tricyclodecyl and 8-ethyl-8-tricyclodecyl.

7. A photoresist composition, comprising:
a photosensitive polymer having a repeating unit represented by Structure (I):

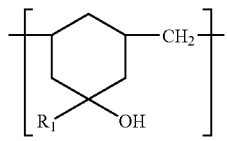

STRUCTURE (I)

wherein $R_1$ is a $C_1$-$C_{20}$ hydrocarbon group or a $C_1$-$C_{20}$ hetero hydrocarbon group including at least one hetero atom selected from the group consisting of nitrogen, fluorine and sulfur; and a photoacid generator (PAG) forming 1-20 wt % of the photoresist composition based on a weight of the photosensitive polymer.

8. The photoresist composition of claim 7, wherein $R_1$ includes at least one substituent selected from the group shown in Substituent Group (I):

SUBSTITUENT GROUP (I)

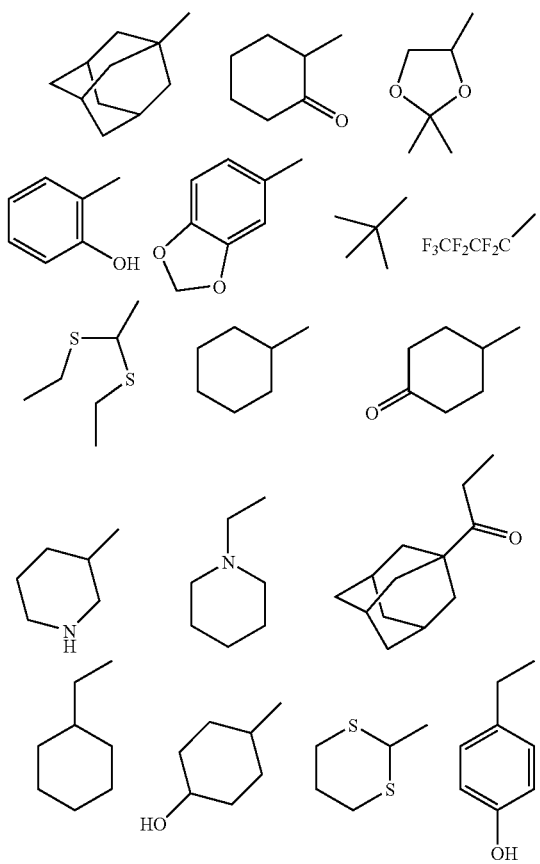

-continued

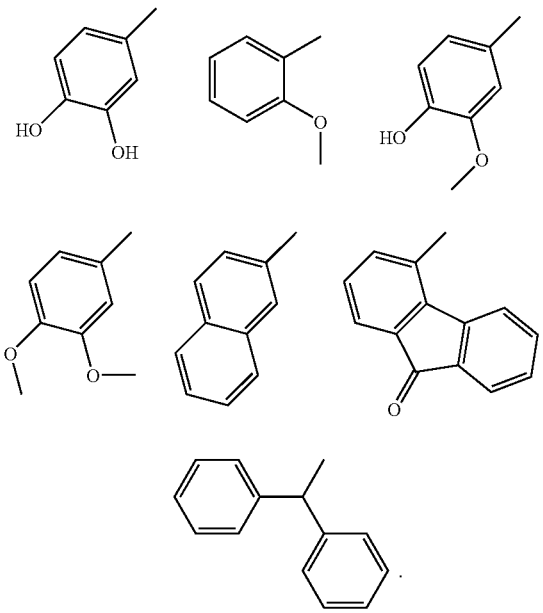

9. The photoresist composition of claim 7, further comprising at least one acid-labile repeating unit selected from the group consisting of acrylate derivatives, methacrylate derivatives, maleic anhydride derivatives, styrene derivatives and norbornene derivatives, wherein the acid-labile repeating unit is coupled with a $C_4$-$C_{20}$ acid-labile substituent.

10. The photoresist composition of claim 9, wherein the acid-labile substituent includes at least one selected from the group consisting of tert-butyl, tetrahydropyranyl, 1-ethoxyethyl, 2-methyl-2-adamantyl, 2-ethyl-2-adamantyl, 2-propyl-2-adamantyl, 8-methyl-8-tricyclodecyl and 8-ethyl-8-tricyclodecyl.

11. The photoresist composition of claim 7, wherein the photoacid generator (PAG) is at least one selected from the group consisting of triallylsulfonium salts, diallyliodonium salts and mixtures thereof.

12. The photoresist composition of claim 7, further comprising an organic base forming 0.1-20 wt % of the photoresist composition based on a weight of the photoacid generator (PAG).

13. The photoresist composition of claim 7, wherein the repeating unit further comprises:

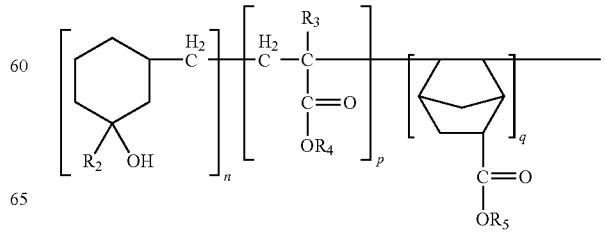

forming Structure (II):

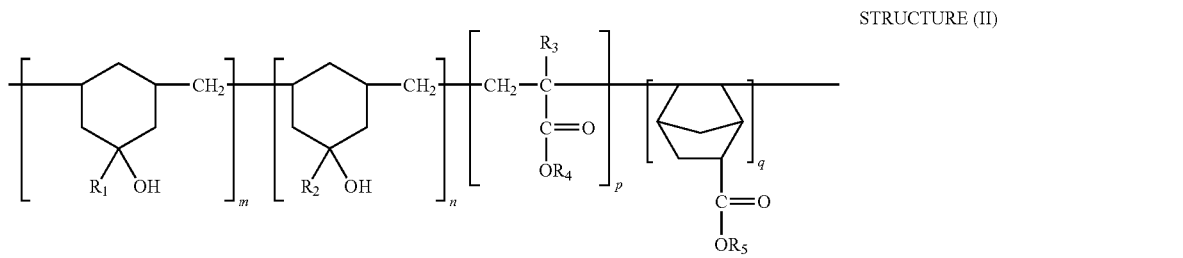

STRUCTURE (II)

wherein $R_2$ is a $C_1$-$C_{20}$ hydrocarbon group or a $C_1$-$C_{20}$ hetero hydrocarbon group including at least one hetero atom selected from the group consisting of nitrogen, fluorine and sulfur, $R_3$ is hydrogen or a methyl group, $R_4$ and $R_5$ are each independently a $C_4$-$C_{20}$ acid-labile substituent, and m, n, p and q are each an integer wherein the expressions $0.1 \leq (m+n)/(m+n+p+q) \leq 0.7$ and $0.3 \leq (p+q)/(m+n+p+q) \leq 0.9$ are satisfied.

14. The photoresist composition of claim 13, wherein the $R_1$ and $R_2$ each independently include at least one substituent selected from the group shown in Substituent Group (I):

SUBSTITUENT GROUP (I)

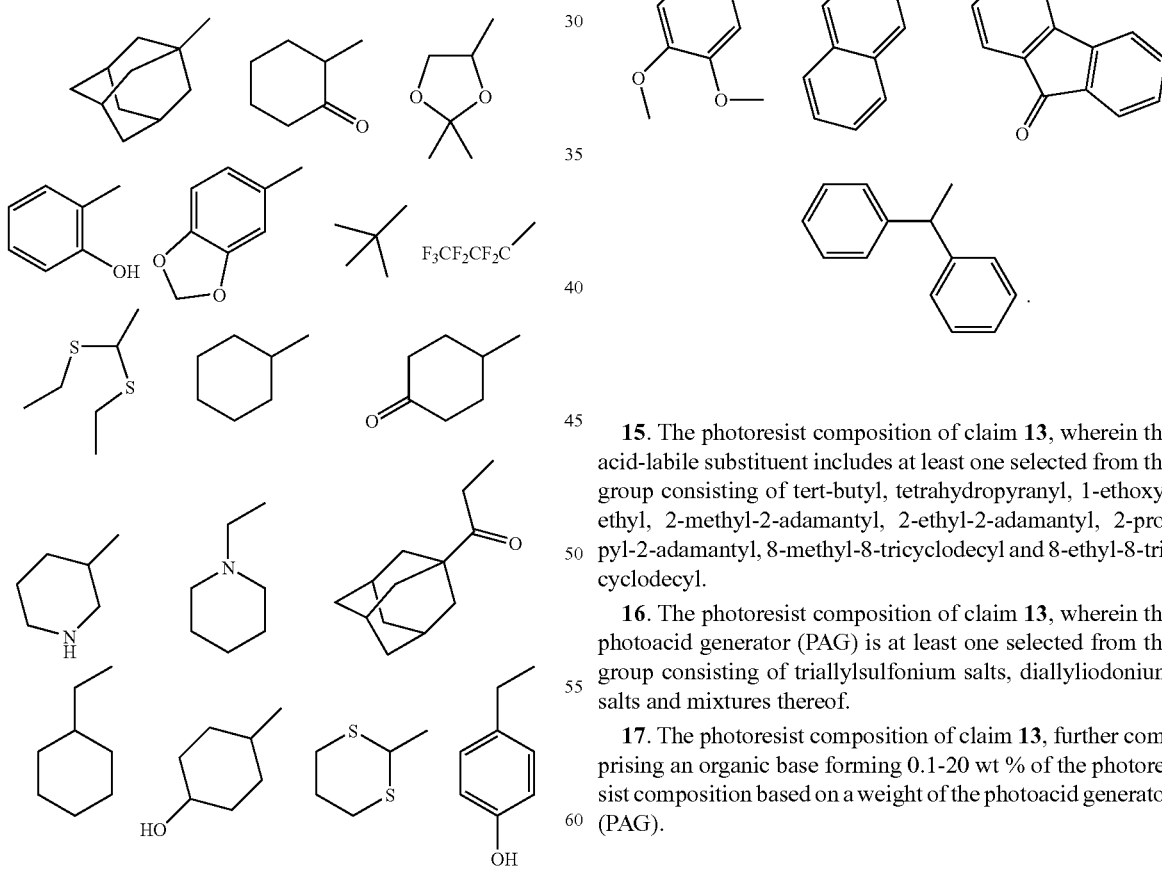

-continued

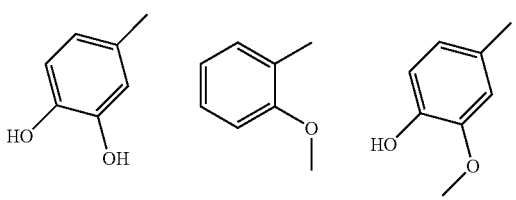

15. The photoresist composition of claim 13, wherein the acid-labile substituent includes at least one selected from the group consisting of tert-butyl, tetrahydropyranyl, 1-ethoxyethyl, 2-methyl-2-adamantyl, 2-ethyl-2-adamantyl, 2-propyl-2-adamantyl, 8-methyl-8-tricyclodecyl and 8-ethyl-8-tricyclodecyl.

16. The photoresist composition of claim 13, wherein the photoacid generator (PAG) is at least one selected from the group consisting of triallylsulfonium salts, diallyliodonium salts and mixtures thereof.

17. The photoresist composition of claim 13, further comprising an organic base forming 0.1-20 wt % of the photoresist composition based on a weight of the photoacid generator (PAG).

* * * * *